United States Patent [19]

Takemae

[11] Patent Number: 4,879,685
[45] Date of Patent: Nov. 7, 1989

[54] SEMICONDUCTOR MEMORY DEVICE WITH INTERNAL ARRAY TRANSFER CAPABILITY

[75] Inventor: Yoshihiro Takemae, Tokyo, Japan
[73] Assignee: Fujitsu Limited, Kawasaki, Japan
[21] Appl. No.: 311,367
[22] Filed: Feb. 16, 1989

Related U.S. Application Data

[63] Continuation of Ser. No. 786,250, Dec. 18, 1985, abandoned.

[30] Foreign Application Priority Data

Oct. 15, 1984 [JP] Japan ................................ 59-215866

[51] Int. Cl.$^4$ .................. G11C 7/00; G11C 11/40; G09G 1/14
[52] U.S. Cl. ............................. 365/189.11; 365/203; 365/189.04; 340/750
[58] Field of Search ................ 365/187, 78, 203, 230, 365/240; 340/750, 800

[56] References Cited

U.S. PATENT DOCUMENTS

| | | | |
|---|---|---|---|
| 3,898,632 | 8/1975 | Spencer, Jr. .......................... | 365/184 |
| 4,162,541 | 7/1979 | Hartke ............................ | 365/174 X |
| 4,386,421 | 5/1983 | Inagaki .............................. | 365/73 X |
| 4,395,764 | 7/1983 | Matsue ............................. | 365/189 X |
| 4,412,313 | 10/1983 | Ackland et al. ..................... | 365/221 |
| 4,429,375 | 1/1984 | Kobayashi et al. ................. | 365/240 |
| 4,602,251 | 7/1986 | Sawada et al. .................. | 340/750 X |
| 4,639,890 | 1/1987 | Heilveil et al. ................. | 340/750 X |
| 4,644,502 | 2/1987 | Kawashima ..................... | 365/240 X |
| 4,661,812 | 4/1987 | Ikeda ............................... | 340/750 X |
| 4,688,197 | 8/1987 | Novak .............................. | 365/240 X |

Primary Examiner—Stuart N. Hecker
Assistant Examiner—Alyssa H. Bowler
Attorney, Agent, or Firm—Staas & Halsey

[57] ABSTRACT

A semiconductor memory device includes, a plurality of word lines, a plurality of bit lines and a plurality of memory cells each connected between the word lines and the bit lines at each intersection of the word lines and bit lines. A plurality of sense amplifiers, each connected to each pair of bit lines, are for amplifying a difference in potential between each of the bit lines; a plurality of bit line reset circuits, each connected to each pair of the bit lines, the difference in potential being held during the read/write cycles. A transfer mode setting circuit is for optionally selecting a first word line and thereafter selecting a second word line, and for simultaneously reading out data in each memory cell connected to the first word line onto each bit line and thereafter simultaneously writing data on each bit line amplified by the sense amplifier into each corresponding memory cell connected to the second word line.

10 Claims, 8 Drawing Sheets

SEMICONDUCTOR MEMORY DEVICE WITH INTERNAL ARRAY TRANSFER CAPABILITY

This is a continuation of co-pending application Ser. No. 786,250, filed on Dec. 18, 1985, now abandoned.

BACKGROUND OF THE INVENTION

1. Field of the Invention

The present invention relates to a semiconductor memory device. More particularly, it relates to a semiconductor memory device providing high speed data transmission between memory cells.

2. Description of the Related Art

In a semiconductor memory device including, for example, a plurality of dynamic type random access memory cells (RAM) each of which comprises a transfer gate transistor and a capacitor, data transmissions are performed between each of the memory cells to move an image on a display apparatus, for example, a cathode-ray tube display (CRT). This movement of the image is, in general, called "scrolling". In a "scrolling" action, the image is moved upward or downward on the display surface. This method is performed in such a way that, first, each word line of the dynamic type RAM corresponds to each horizontal scanning line of the CRT; second, in the case of upward "scrolling", the data of each memory cell connected to the second word line is transferred to each memory cell connected to the first word line, and the data of each memory cell connected to the third word line is transferred to each memory cell connected to the second word line. A similar operation is repeatedly performed to each memory cell connected for the final word line.

In the conventional method, however, it is difficult to achieve high speed "scrolling" because data transmission is sequentially performed for every memory cell. That is, first, data of one memory cell is read out; second, the read out data is written in an external register; third, the data in the external register is read out; and finally, the read out data is written in the other memory cell. These read out/write cycles are performed for each and every memory cell.

This problem will be explained in detail hereinafter.

SUMMARY OF THE INVENTION

The primary object of the present invention is to provide a semiconductor memory device providing high speed data transmission between each of the memory cells, thereby achieving high speed "scrolling" of an image on a display apparatus.

Another object of the present invention is to provide a semiconductor memory device producing a reduction in power consumption when "scrolling" an image on a display apparatus.

In accordance with the present invention there is provided a semiconductor memory device including a plurality of word lines a plurality of bit lines and a plurality of memory cells each connected between the word lines and the bit lines at each intersection of the word lines and bit lines. Also included are a plurality of sense amplifiers, each connected to a pair of bit lines, for amplifying a difference in potential between each of the bit lines and a plurality of bit line reset circuits, each connected to a pair of the bit lines, and the difference of potential being held thereby during a read/write cycle. A transfer mode setting circuit is also included for arbitrarily selecting one word line and thereafter selecting another word line, and for simultaneously reading out data in each memory cell connected to the one word line to each bit line and thereafter simultaneously writing data in each bit line amplified by the sense amplifier to each corresponding memory cell connected to the other word line.

DESCRIPTION OF THE PREFERRED EMBODIMENTS

Before describing the preferred embodiments, an explanation will be given of a conventional semiconductor memory device using a dynamic type RAM.

Figure 1:
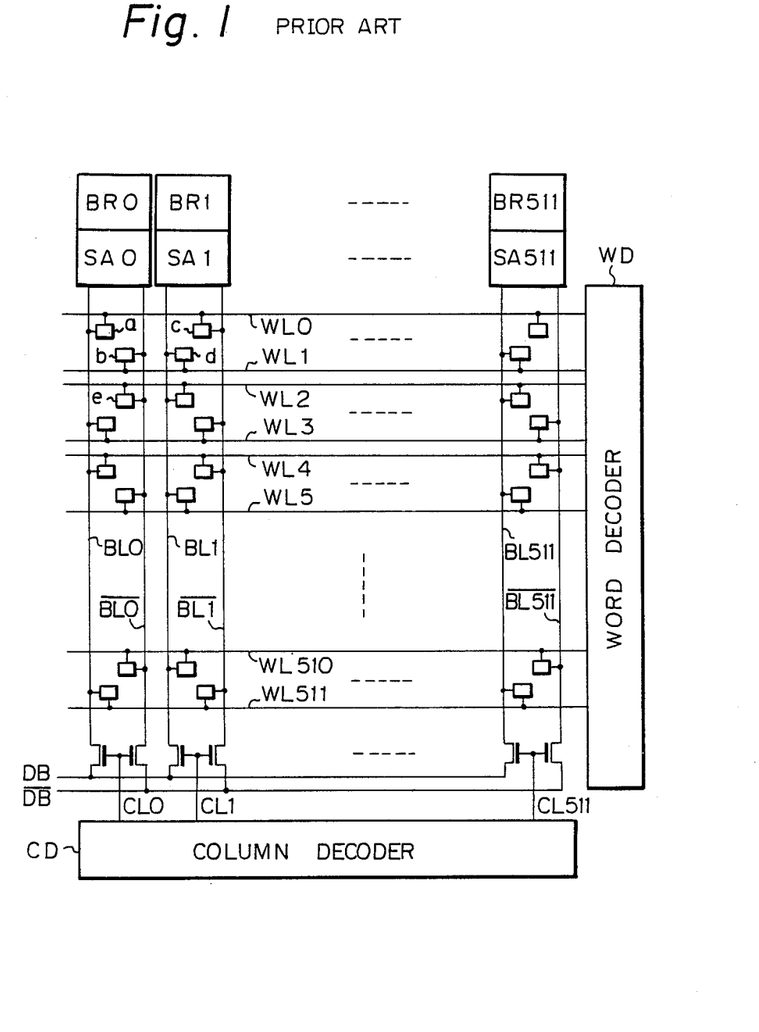
FIG. 1 is a schematic circuit diagram of a conventional semiconductor memory device.

Referring to FIG. 1, WD represents a word decoder, WL0, WL1, . . . WL511 word lines, CD a column decoder, CL0, CL1, . . . CL511 column selection lines, BL0, $\overline{BL0}$, BL1, $\overline{BL1}/$, . . . BL511, $\overline{BL511}$ bit lines, DB, $\overline{DB}$ data busses, a, b, c . . . memory cells, SA0, SA1, . . . SA511 sense amplifiers, and BR0, BR1, . . . BR511 bit line reset circuits.

Figure 2:
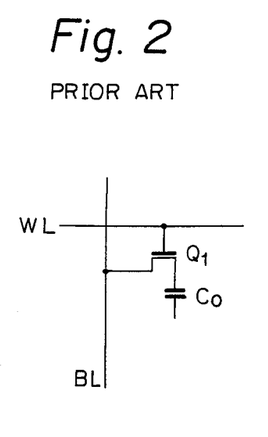
FIG. 2 is a circuit for one of the memory cells shown in FIG. 1.

Each memory cell (a, b, c . . . ) comprises a metaloxide-semiconductor (MOS) transistor Q1 as the transfer gate and a capacitor $C_0$ as the memory element, as shown in FIG. 2. That is, in this embodiment, the memory cell is a one transistor-capacitor type. As is known, when the transistor Q1 is turned ON, the potential of the capacitor $C_0$ is changed to the potential of the bit line BL so that a read or write operation is performed.

Figure 3:
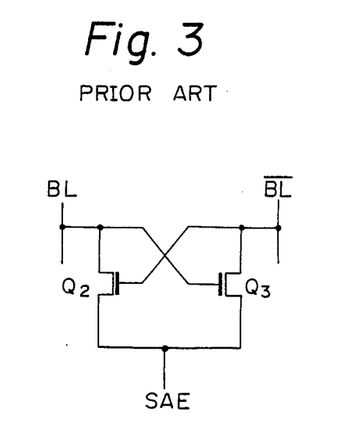
FIG. 3 is a circuit for one of the sense amplifiers shown in FIG. 1.

Each sense amplifier SA0 to SA511 comprises two MOS transistors Q2 and Q3, each of which is cross-connected as shown in FIG. 3. When a sense amplifier enable (SAE) signal is input to both transistors, so that they are activated by the SAE signal, the difference in potential between each of the bit lines BL and $\overline{BL}$ is amplified.

Figure 4:
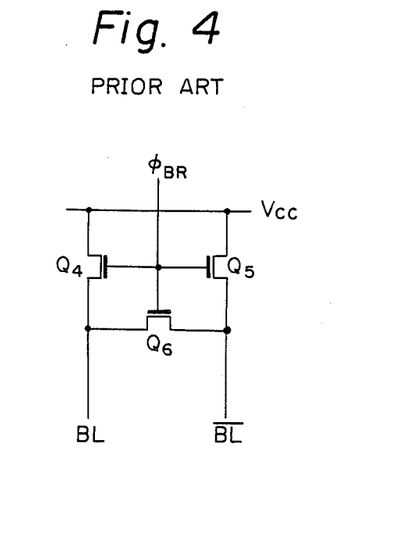
FIG. 4 is a circuit for one of the bit line reset circuits shown in FIG. 1.

Each of the bit line reset circuits BR0 to BR511 comprises three MOS transistors $Q_4$, $Q_5$, and $Q_6$ as shown in FIG. 4. When a bit line reset signal $\phi_{BR}$ is input to these transistors, they are turned ON so that the bit lines BL and $\overline{BL}$ are short-circuited by the transistor $Q_6$ and the potentials of both bit lines are reset to the power source potential $V_{CC}$.

Figure 5:
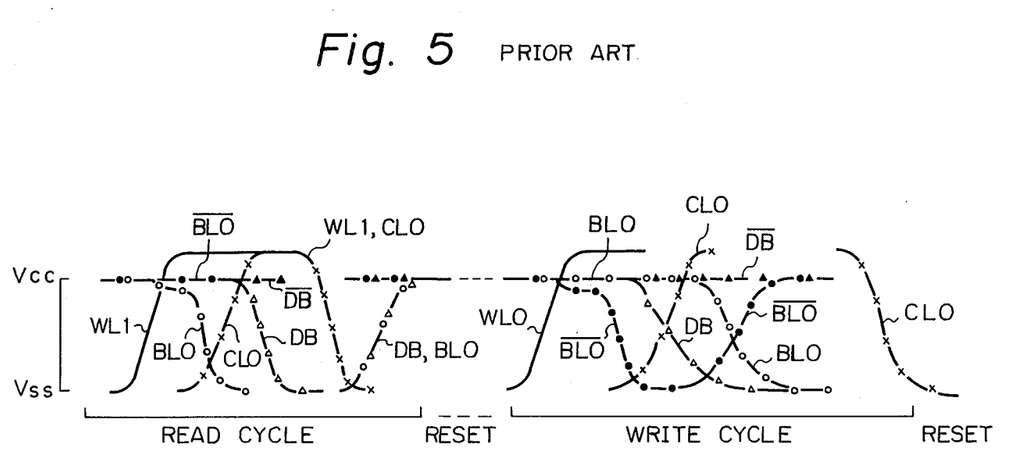
FIG. 5 is a timing chart for explaining data transmission to each of the memory cells shown in FIG. 1.

FIG. 5 is a timing chart for explaining data transmission between each of the memory cells, for example, from the memory cell b connected to the word line WL1 to the memory cell a connected to the word line WL0.

In FIG. 5, $V_{CC}$ represents the power source potential, and $V_{SS}$ the earth or ground potential. One data transmission operation includes a read-out cycle and a write cycle.

When the word line WL1 is at a high level (a selection state) in the read-out cycle, the data stored in the memory cell b is read out to the bit line so that a small difference in potential occurs between bit lines BL0 and $\overline{BL0}$. This small difference in the potential is amplified by the sense amplifier SA0 so that a large difference in the potential is applied between the bit lines BL0 and $\overline{BL0}$. When the column selection line CL0 is at the high level, the amplified bit line data is output to the data busses DB and $\overline{DB}$. The data on the busses DB and $\overline{DB}$ is stored in a data register (not shown). Next, the word line WL1 and the column selection line CL0 are set to a low level (a non-selection state), and the potentials of both bit lines BL0 and $\overline{BL0}$ are reset (pre-charged) to the power source potential $V_{CC}$ by the bit line reset circuit shown in FIG. 4. The read-out cycle is completed by these procedures.

When the word line WL0 is switched to a high level (the selection state) in the write cycle, first, the data of the memory cell a is read out so that the bit line BL0 becomes the high level and the bit line $\overline{BL0}$ becomes the low level, then, the column selection line CL0 becomes the high level. When the data stored in each data register (not shown) at the previous read-out cycle is applied to the data bus, the data bus DB becomes the low level and the data bus $\overline{DB}$ becomes the high level, so that the potential of the bit line BL0 is inverted to the low level and that of the bit line $\overline{BL0}$ is inverted to the high level. Consequently, the data in the memory cell a is replaced (written) with the data in the memory cell b. Next, the column selection line CL0 is set to the low level and the write cycle is completed by these procedures.

In the above-explained conventional method, the data transmission necessitates two cycles, in order to transfer the data from the memory cell b to the memory cell a. That is, one cycle including reading out from cell b and writing to the register, and the second cycle including reading out from the register and writing to cell a. For example, when 512 memory cells (256 KRAM) are connected to the one word line, 1024 cycles (2 cycles × 512) are necessary for "scrolling" one word line. Moreover, when there are 512 word lines on the display surface, the necessary scroll cycle then becomes (1024 × 512) cycles.

A semiconductor memory device using a dynamic type RAM according to an embodiment of the present invention will be now described.

Figure 6:
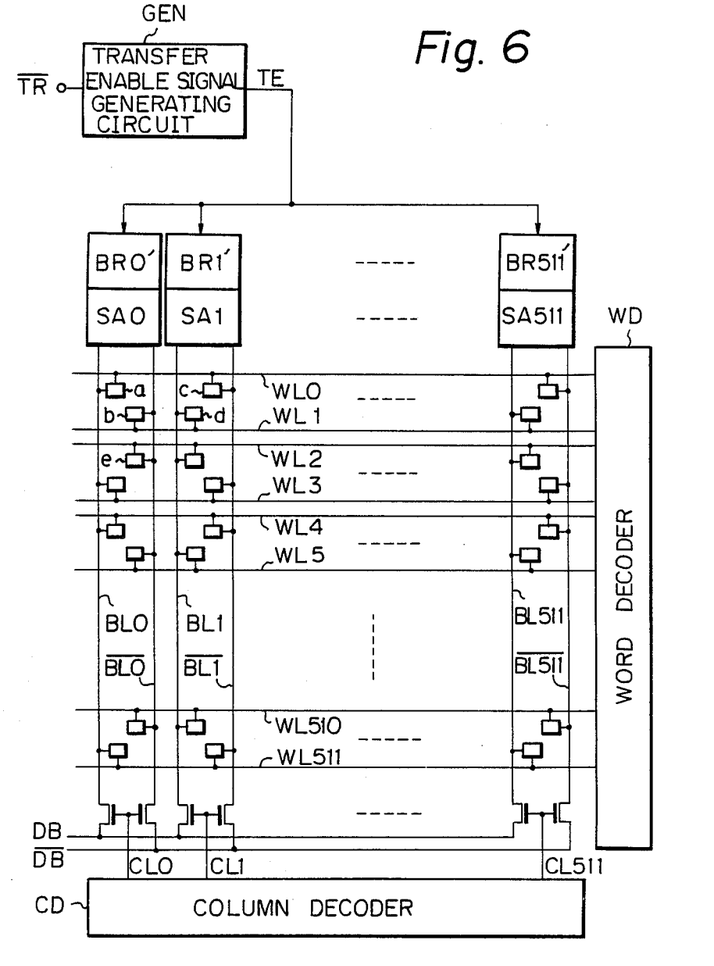
FIG. 6 is a schematic circuit diagram of a semiconductor memory device according to an embodiment of the present invention.
Figure 10:
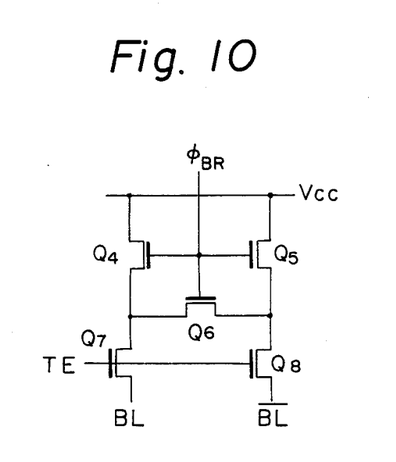
FIG. 10 is a bit line reset circuit according to the present invention.

Referring to FIG. 6, a transfer enable signal generating circuit GEN is added to the conventional semiconductor memory device shown in FIG. 5. This circuit GEN is used for the transfer mode. In this case, high speed "scrolling" according to the present invention is performed by selecting an arbitrary word line in the transfer mode. Moreover, new bit line reset circuits BR0', BR1' ... BR511' shown in FIG. 10 are provided instead of the conventional bit line reset circuits.

A transfer signal $\overline{TR}$ is input to the generating circuit GEN. This transfer signal $\overline{TR}$ is generated by a "scrolling" command applied from a keyboard (not shown) by an operator. When the transfer signal $\overline{TR}$ is the low level, the generating circuit GEN generates a transfer enable signal TE in the form of a pulse. When the transfer enable signal TE is the low level and is input to each bit line reset circuit BR0' to BR511', the operation of each bit line reset circuit is inhibited by this low level signal. That is, as shown in FIG. 10, when the low level transfer enable signal TE is input to both gates of the transistors Q7 and Q8, transistors Q7 and Q8 are cut off by this signal TE. In this case, alternatively, the transfer enable signal TE may be input to a reset signal $\phi_{BR}$ generating circuit (not shown), and the reset signal generating circuit can inhibit generation of the signal $\phi_{BR}$ when the transfer enable signal TE is the low level. Moreover, the operation of the column decoder CD is inhibited during the low level state of the transfer enable signal TE, and in this case, no columns are selected.

Figure 7:
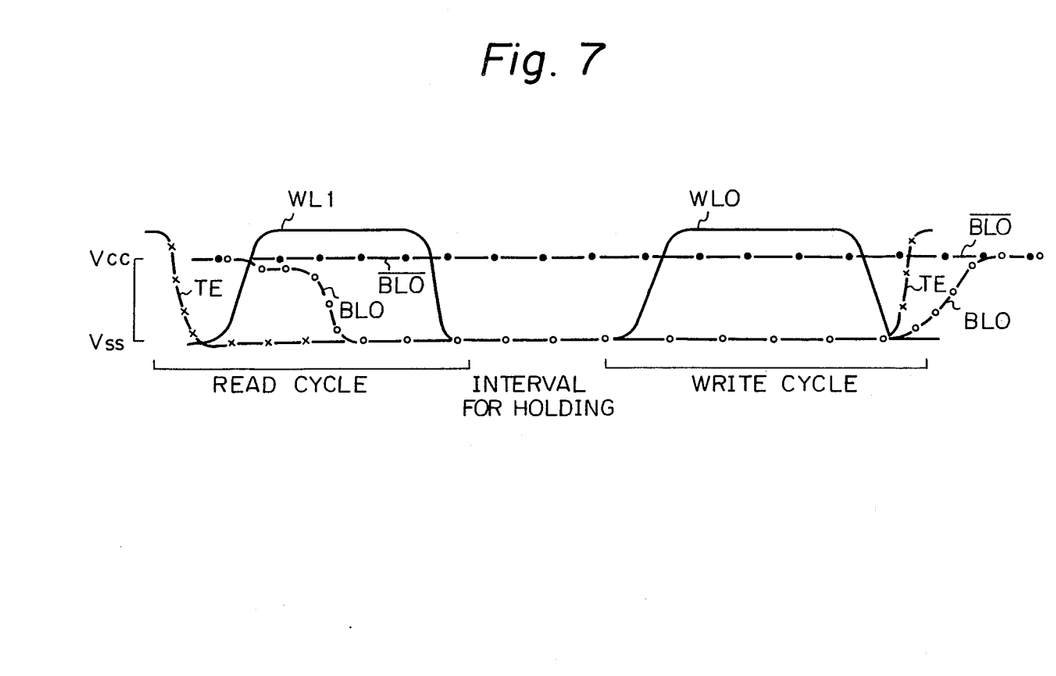
FIG. 7 is a timing chart for explaining data transmission according to the embodiment shown in FIG. 6.

FIG. 7 is a timing chart for explaining data transmission according to the first embodiment of the present invention. In FIG. 7, when the transfer enable signal TE is set to the low level and the word line WL1 is switched to the high level (the selection state) in the read-out cycle, a small difference in potential occurs between the bit line BL0 and $\overline{BL0}$. This small difference in the potential also simultaneously occurs in all other bit lines corresponding to the data of each memory cell b, d ... on the word line WL1. Each small difference in the potential is amplified by each sense amplifier SA0, SA1 ... SA511, so that a large difference in the potential is applied between each pair of bit lines. In FIG. 7, the chart for only one pair of bit lines BL0 and $\overline{BL0}$ are shown, to facilitate the explanation. As mentioned above, after all data in the memory cells connected to the word line WL1 are read out to the corresponding bit line, the word line WL1 is switched to the low level (the non-selection state). The read-out cycle is completed by these procedures. In this case, each sense amplifier SA0 to SA511 is activated by the sense amplifier enable signal SAE so that the potentials of both bit lines BL0 and $\overline{BL0}$ are held as they are for a short interval.

When the word line WL0 is switched to the high level in the write cycle, all data in the bit lines is simultaneously written to the corresponding memory cells a, c, ... on the word line WL0. That is, when the word line to be selected is selected by the word decoder WD, all data in the bit lines is simultaneously written into the corresponding memory cell connected to the selected word line. Although only the bit lines BL0 and $\overline{BL0}$ are shown in FIG. 7, similar timing charts are applicable to the other bit lines. When the writing is completed, the word line WL0 is set to the low level. Moreover, the transfer enable signal TE is set to the high level so that each bit line reset circuit BR0' to BR511' shown in FIG. 10 is activated by this signal TE. The bit lines BL0 and $\overline{BL0}$ are reset (pre-charged) to the power source potential $V_{CC}$ and the write cycle is completed by these procedure.

As mentioned above, in the read-out cycle, no "precharging" of the bit lines is performed by each bit line reset circuit BR0' to BR511' in the time interval between the read cycle and the write cycle, and no column selections are performed by the column decoder CD. These methods are features of the present invention and are different from the conventional method shown in FIGS. 1 and 5.

Accordingly, although the data transmission per word line requires of 1024 cycles in the conventional method, it requires only two cycles per word line according to the present invention. Consequently, high speed "scrolling" can be achieved according to the present invention. Moreover, power consumption for "scrolling" can be considerably reduced by applying the low level of the transfer enable signal TE to the column decoder CD, thereby inactivating same.

Figure 8:
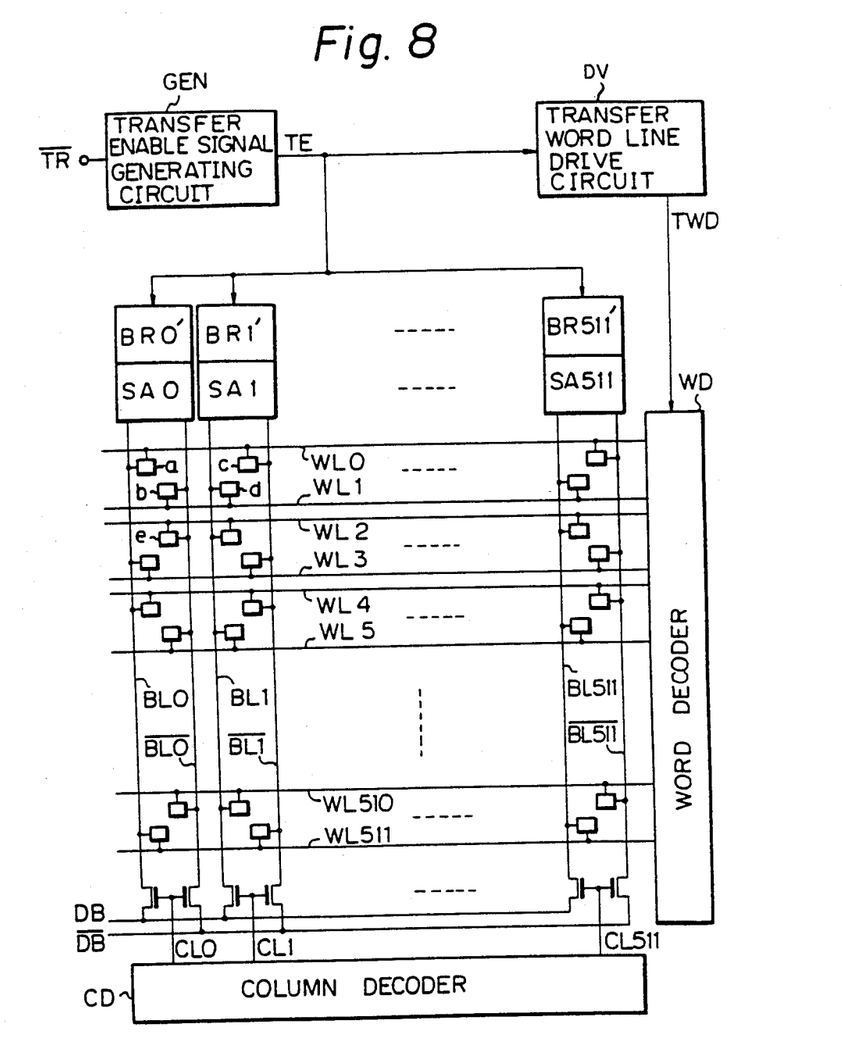
FIG. 8 is a schematic circuit diagram of a semiconductor memory device according to another embodiment of the present invention.
Figure 9:
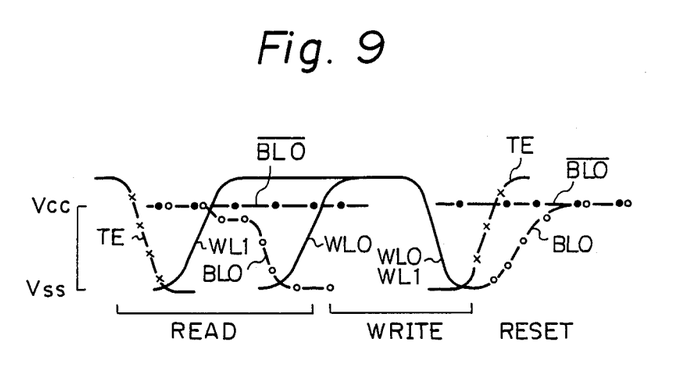
FIG. 9 is a timing chart for explaining data transmission according to the embodiment shown in FIG. 8.

FIG. 8 is a schematic circuit diagram according to another embodiment of the present invention. Referring to FIG. 8, a transfer word line drive circuit DV is added to the circuit of the first embodiment shown in FIG. 6. In this embodiment, the word line for the write cycle is selected after a short delay time as shown in FIG. 9. The timing of the selection of the word line is determined by a transfer word drive signal TWD generated by the drive circuit. This signal TWD is generated based on the timing of the transfer enable signal TE.

FIG. 9 is a timing chart for explaining data transmission according to another embodiment of the present invention. In FIG. 9, when the word line WL1 is switched to the high level in the read-out cycle, the word line WL0 to be selected is also set to high high level after a short delay time from the selection of the word line WL1. In this case, the word line WL1 is not switched to the low level before the selection of the word line WL0.

When the word line WL0 is switched to the high level, the same procedure as shown in FIG. 7 is performed in the write cycle. Accordingly, both word lines WL1 and WL0 are simultaneously set to the low level when the write cycle is completed.

As mentioned above, in this embodiment, the data transmission time per one word line can be reduced to less than that of the two cycles shown in the first embodiment. As is obvious from FIGS. 7 and 9, the time interval, during which the potential of bit lines BL0 and $\overline{BL0}$, is held is necessary in the first embodiment because no word line drive circuit is provided. Alternatively, no time interval is necessary in the second embodiment because a word line drive circuit is provided. Consequently, the data transmission time per word line can be considerably reduced, and high speed "scrolling" can be achieved according to the second embodiment.

Figure 11:
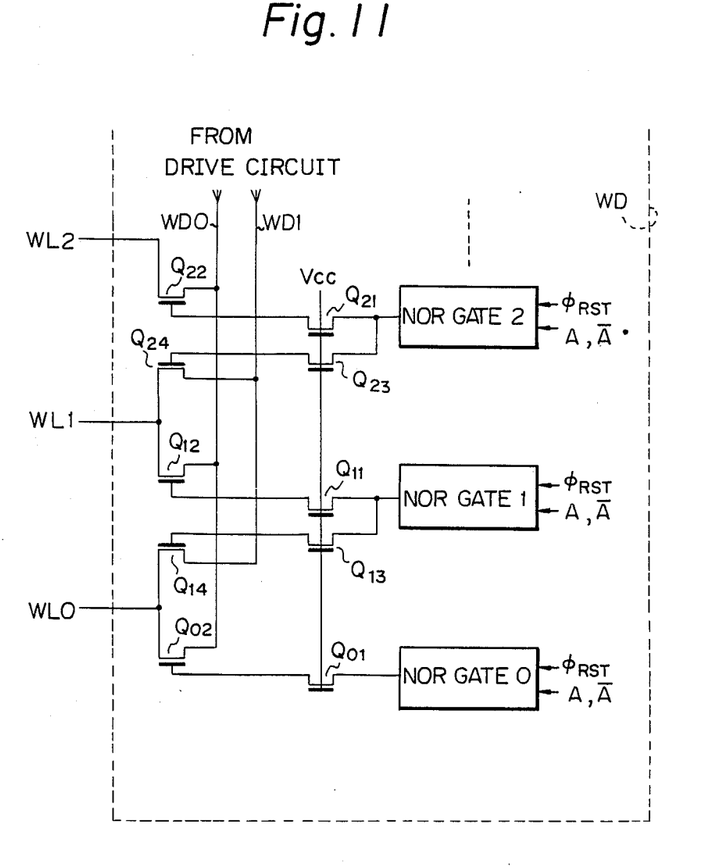
FIG. 11 is a detailed partial circuit of a word decoder shown in FIG. 8.

FIG. 11 is a detailed partial circuit of the word decoder WD according to the embodiment shown in FIG. 8. Here, the word drive lines WD0 and WD1 are connected to the transfer word line drive circuit DV. The transfer word drive signal TWD is applied to these lines from the drive circuit DV. Each NOR GATE (0 to 511) is connected to the corresponding word line (0 to 511) through gate transistors.

When the NOR GATE 1, for example, is selected by address signals A, $\overline{A}$ and a reset signal $\phi_{RST}$, the gate transistor $Q_{12}$ is turned ON and the word line WL1 is driven by the word drive line WD0. When the data is transferred to the adjacent word line WL0, the drive signal TWD is applied on the drive line WD1 so that the word drive line WD1 is driven, then, the word line WL0 is driven by the word drive line WD1 since the gate transistor $Q_{14}$ is already turned ON.

The data transmission for every word line is not limited to adjacent word lines. For example, the word line WL5 can be selected and the data of the memory cells connected to the word line WL5 can be read out, then the word line WL0 can be selected and the data of the memory cells connected to the word line WL5 can be written into the memory cells connected to the word line WL0. That is, a so-called jump type data transmission is possible according to the present invention. This method is advantageous for, for example, the "scrolling" of characters.

What is claimed is:

1. A semiconductor memory device, comprising:
    a plurality of word lines;
    a plurality of bit lines;
    a memory cell array, including:
        a plurality of memory cells connected between said word lines and said bit lines at intersections of said word lines and bits lines; and
        a plurality of sense amplifiers, each connected to a pair of bit lines, for amplifying a difference in potential between respective said bit lines;
    a plurality of bit line reset means, each connected to a pair of said bit lines, for resetting all said bit lines to a reset potential both before and after a read/write cycle; and
    transfer control means for arbitrarily selecting a first word line and thereafter selecting a second word line, and for simultaneously reading out data in each memory cell within the array connected to said first word line to each bit line and thereafter simultaneously writing data in each bit line amplified by said sense amplifier to each corresponding memory cell within the array connected to said second word line and producing a parallel data transfer, within the array, from memory cells corresponding to the first word line to memory cells corresponding to the second word line, said transfer control means including inhibit means, connected to said bit line reset means, for inhibiting resetting of said bit lines during the parallel data transfer, directly writing potentials developed on said bit lines during the reading out into memory cells connected to said second word line during the writing.

2. A semiconductor memory device as claimed in claim 1, wherein said transfer control means comprises a transfer enable signal generating circuit, connected to said bit line reset means which generates a transfer enable signal in response to an input transfer signal to hold the potential between each of said bit lines using said bit line reset means.

3. A semiconductor memory device as claimed in claim 2, wherein said transfer control means further comprises a transfer word line drive circuit, operatively connected to said word lines and said transfer enable generating circuit, which generates a transfer word drive signal to select said first and second word lines.

4. A semiconductor memory device as claimed in claims 1, 2 or 3, wherein said transfer control means further comprises a word decoder, connected to said word lines and said transfer word line drive circuit, which selects said first and second word lines based on said transfer word drive signal.

5. A semiconductor memory device as claimed in claim 2, wherein said transfer enable signal has a low level and said bit line reset means comprises a MOS transistor connected to each bit line, each MOS transistor having a gate receiving said transfer enable signal and each of said MOS transistors being cut off when the low level of said transfer enable signal is input to each of said gates.

6. A semiconductor device as claimed in claim 1, further comprising decoder means for providing a first selection signal for the first word line in response to a first address and for providing a second selection signal for an adjacent word line in response to the first address and an adjacent word line selection signal.

7. A semiconductor device as claimed in claim 1, further comprising decoder means for providing a first selection signal for the first word line in response to a first address and for providing a second selection signal for the second word line in response to a second address.

8. A semiconductor memory device, comprising:
transfer enabling means for signalling a scrolling transfer;
a memory cell array having multiple memory cells with bit lines; and
transfer control means, operatively connected to said transfer enabling means and said memory cell array, for controlling simultaneous parallel transfer of the contents of the multiple memory cells internally between the multiple memory cells within the array using the bit lines for memory cell content storage during the transfer.

9. A semiconductor device as claimed in claim 8, wherein the parallel transfer occurs within one memory cycle.

10. A semiconductor memory device, comprising:
a plurality of word lines;
a plurality of bit lines;
a plurality of memory cells respectively connected between said word lines and said bit lines at intersections of said word lines and bit lines;
a plurality of sense amplifiers, each connected to a pair of bit lines, for amplifying a difference in potential between respective said bit lines;
a plurality of bit line reset means, each connected to a pair of said bit lines, for holding the difference in potential during a combined read/write memory cycle; and
transfer control means for arbitrarily selecting a first word line and thereafter selecting a second word line, and for simultaneously, during one combined read/write memory cycle, reading out data in each memory cell connected to said first word line onto each bit line and thereafter also simultaneously writing data on each bit line amplified by said sense amplifiers to each corresponding memory cell connected to said second word line using said bit lines to hold cell contents during the reading and writing, said transfer control means selecting any one of said word lines as either said first or second word line during each combined read/write memory cycle.

* * * * *

UNITED STATES PATENT AND TRADEMARK OFFICE
CERTIFICATE OF CORRECTION

PATENT NO. : 4,879,685

DATED : November 7, 1989

INVENTOR(S) : Yoshihiro Takemae

It is certified that error appears in the above-identified patent and that said Letters Patent is hereby corrected as shown below:

Front Page, [63] line 1, "Dec. 18, 1985" s/b --October 10, 1985--.

Col. 1, line 6, "Dec. 18, 1985" s/b --Oct. 10, 1985--;
    line 33, "to" s/b --for--;
    line 34, "for" s/b --to--.

Col. 2, line 43, "$\overline{BL1/}$," s/b --$\overline{BL1}$,--.

Col. 4, line 68, delete "of".

Col. 5, line 22, "to high high" s/b --to the high--.

Signed and Sealed this

Nineteenth Day of February, 1991

*Attest:*

HARRY F. MANBECK, JR.

*Attesting Officer*   *Commissioner of Patents and Trademarks*